(12) United States Patent
Gautama et al.

(10) Patent No.: US 12,225,360 B2
(45) Date of Patent: Feb. 11, 2025

(54) AUDIO PROCESSOR

(71) Applicant: NXP B.V., Eindhoven (NL)

(72) Inventors: Temujin Gautama, Boutersem (BE); Christophe Marc Macours, Hodelge (BE); Bram Hedebouw, Heverlee (BE)

(73) Assignee: NXP B.V., Eindhoven (NL)

( * ) Notice: Subject to any disclaimer, the term of this patent is extended or adjusted under 35 U.S.C. 154(b) by 207 days.

(21) Appl. No.: 17/808,622

(22) Filed: Jun. 24, 2022

(65) Prior Publication Data

US 2023/0007395 A1   Jan. 5, 2023

(30) Foreign Application Priority Data

Jul. 5, 2021   (EP) .................................... 21183787

(51) Int. Cl.
*H04R 3/00* (2006.01)
*H04R 3/04* (2006.01)

(52) U.S. Cl.
CPC .................................... *H04R 3/04* (2013.01)

(58) Field of Classification Search
CPC ....... H04R 3/007; H03G 11/04; H03G 11/008
See application file for complete search history.

(56) References Cited

U.S. PATENT DOCUMENTS

| | | |
|---|---|---|
| 2009/0316557 A1 | 12/2009 | Sasaki et al. |
| 2013/0088294 A1 | 4/2013 | Heineman et al. |
| 2019/0116419 A1* | 4/2019 | Napoli .................. H04R 3/007 |

FOREIGN PATENT DOCUMENTS

| | | |
|---|---|---|
| EP | 2490458 A1 | 8/2012 |
| JP | 2006-197580 A | 7/2006 |

OTHER PUBLICATIONS

Hamblen: "Using a Speaker for Audio Output," webpage: https://os.mbed.com/users/4180_1/notebook/using-a-speaker-for-audio-output/, pp. 1-24.
Hinerman: "Low-Cost Techniques for Sound Generation," webpage: https://www.eetimes.com/low-cost-techniques-for-sound-generation/, pp. 1-7.
Wikipedia: "PC speaker," webpage: https://en.wikipedia.org/wiki/PC_speaker, pp. 1-5.

* cited by examiner

*Primary Examiner* — Ping Lee

(57) ABSTRACT

An audio processor and method of audio processing for an amplifier system is described. The audio processor may receive an audio signal and adapt the audio signal generating a time varying offset. The time varying offset may be combined with the audio signal resulting in a shifted the audio signal level. The processed audio signal may also be clipped to remove the negative samples values. The processed signal may be used to drive an amplifier designed to only accept positive (or negative) signals such as a class C amplifier.

16 Claims, 4 Drawing Sheets

300

350

AUDIO PROCESSOR

CROSS-REFERENCE TO RELATED APPLICATIONS

This application claims the priority under 35 U.S.C. § 119 of European Patent application no. 21183787.7, filed on 5 Jul. 2021, the contents of which are incorporated by reference herein.

FIELD

This disclosure relates to an audio processor and method of audio processing for an amplifier system.

BACKGROUND

A typical audio amplifier is designed to apply positive and negative voltages across an output load which is typically a loudspeaker. This is necessary to reproduce an audio signal, which has an average value of zero, with positive and negative signal values. Typical audio amplifier types are class A, class AB, and class D amplifiers.

Class A amplifiers require the lowest number of active components: only a single transistor. The transistor needs to be appropriately biased by setting its central operating point, which is called the "Quiescent Operating Point", or Q-point for short. In a class A amplifier, the transistor is biased so that the Q-point is near the middle of its operating range approximately halfway between the cut-off and saturation points. In this configuration, the output voltage can vary around the Q-point without distortion as the input varies. As a consequence, there is always a DC quiescent current flowing through the transistor even if there is no input signal to amplify. This means that the output load current is approximately the same with and without an audio input signal, making a heatsink necessary in most cases.

A class C amplifier is also a single transistor amplifier but is not used as an audio amplifier because of the high distortion levels. In a class C amplifier the transistor is on only for the positive values of the input signal, and is off for the negative or sub-threshold values. The Q-point is set much lower than for a class A near the cut-off point of the transistor. The net result is roughly that the input signal is negatively limited or clipped to 0 which results in high audio distortion.

Pulse-width-modulation (PWM) can be used to represent an audio signal. PWM encodes the digital sample value by varying a duty cycle of a rectangular wave at a frequency typically much higher than the audio sampling rate. A class D audio amplifier uses a PWM signal at its input to generate an amplified audio signal at its output by appropriately switching transistors on and off. Typically the class D amplifier has an H-bridge configuration using two transistors. FIG. 1 shows an example known PWM amplifier 100 using a single transistor T1 which as illustrated is an NPN transistor. The base and emitter of T1 are connected to ground 108. The PWM input 102 may be connected via a resistance 106 to the base of transistor T1. Circuit node 110 may be connected to the collector of T1. The load 112 which is typically a loudspeaker is connected between circuit node 110 and the supply 104. An optional fly-back diode D1 which is typical for a partly inductive load such as a loudspeaker may be connected between circuit node 110 and supply 104. When the audio signal is zero corresponding to a period of silence, the PWM duty cycle is 50%, and the transistor T1 will be on half of the time.

SUMMARY

Various aspects of the disclosure are defined in the accompanying claims. In a first aspect there is provided an audio processor for an amplifier system, the audio processor comprising: an audio processor input configured to receive an audio signal; an audio processor output configured to be coupled to an amplifier; wherein the audio processor is configured to process the audio signal by: determining a time-varying offset from the audio signal; either (i) combining the time-varying offset with the audio signal resulting in an offset audio signal, and clipping the offset audio signal, or (ii) clipping the audio signal with a clip level being determined from the time-varying offset value, and combining the time-varying offset with the clipped audio signal; outputting the processed audio signal on the audio processor output.

In one or more embodiments, the audio processor may comprise: an offset estimator having an offset estimator input coupled to the audio processor input and an offset estimator output; a series arrangement of a combiner and a clipper between the audio processor input and the audio processor output; and wherein the offset estimator is configured to generate the time-varying offset; the combiner is configured to add the time-varying offset to or subtract the time-varying offset from one of the audio signal and the offset audio signal; and the clipper is configured to clip one of the audio signal and the offset audio signal by modifying at least one of the respective audio signal values above a first clip level value and the respective audio signal values below a second clip level value.

In one or more embodiments, a first combiner input is coupled to the audio processor input, a second combiner input is coupled to the offset estimator output, a combiner output is coupled to a first clipper input, the audio processor output is coupled to a clipper output; and a second clipper input is configured to receive the clip level.

In one or more embodiments, a first clipper input is coupled to the audio processor input, a second clipper input is coupled to the offset estimator output, and a clipper output coupled to a first combiner input, a second combiner input is coupled to the offset estimator output, and the audio processor output is coupled to the combiner output wherein one of the first clip level and the second clip level is determined from the offset estimator output.

In one or more embodiments, the clipper may comprise at least one of a rectifying linear activation unit and a logistic function module.

In one or more embodiments, the offset estimator may comprise a peak detector and is configured to determine the time-varying offset value from one of detected negative peak values and detected positive peak values of the audio signal.

In one or more embodiments, the peak detector may comprise a smoothing filter, and the absolute value of the detected peak value may increase at a first rate and decrease at a second rate, and wherein the first rate is less than the second rate.

In one or more embodiments, the audio processor may comprise an attenuator arranged between the audio processor input and the combiner.

In one or more embodiments, the audio processor may comprise a delay element arranged to delay the audio signal received at the first combiner input relative to the audio signal received at the offset estimator input.

In one or more embodiments, the audio processor may be included in an audio amplifier system. The amplifier system may further comprise a series arrangement of a digital to analog converter (DAC) and an amplifier circuit, wherein the audio processor output is coupled to the DAC input and wherein the amplifier circuit is configured as one of a class C amplifier and a class D amplifier. The amplifier circuit may comprise a single-transistor amplifier circuit.

In a second aspect there is provided a method of audio processing for an amplifier system, the method comprising: providing an audio signal; generating a time-varying offset value determined from the audio signal; providing a processed audio signal by either: (i) combining the time-varying offset with the audio signal resulting in an offset audio signal, and clipping the offset audio signal; or (ii) clipping the audio signal with a clip level being determined from the time-varying offset value, and combining the time-varying offset with the clipped audio signal; outputting the processed audio signal.

In one or more embodiments, clipping the audio signal or offset audio signal may further comprise modifying at least one of the respective audio signal values above a first clip level value and the respective audio signal values below a second clip level value.

In one or more embodiments, clipping the audio signal or offset audio signal may further comprise applying one of a rectifying linear activation function and a logistic function.

In one or more embodiments, generating a time-varying offset comprises detecting a negative peak value or positive peak value of the audio signal.

In one or more embodiments, detecting a negative peak value or positive peak value may comprise applying a smoothing filter, and wherein the absolute value of the detected peak value increases at a first rate and decreases at a second rate, and wherein the first rate is less than the second rate.

In one or more embodiments, the method may further comprise attenuating the audio signal.

In one or more embodiments, the method may further comprise delaying the audio signal before combining the time-varying offset with the audio signal or the clipped audio signal.

In a third aspect there is provided a non-transitory computer readable media comprising a computer program comprising computer executable instructions which, when executed by a computer, causes the computer to perform the steps of audio processing for an amplifier system by: providing an audio signal; generating a time-varying offset value determined from the audio signal; providing a processed audio signal by either: (i) combining the time-varying offset with the audio signal resulting in an offset audio signal, and clipping the offset audio signal; or (ii) clipping the audio signal with a clip level being determined from the time-varying offset value, and combining the time-varying offset with the clipped audio signal; outputting the processed audio signal.

In one or more embodiments, the computer executable instructions when executed by a computer, causes the computer to further perform the steps of: generating a time-varying offset by detecting a negative peak value or positive peak value of the audio signal; wherein the absolute value of the detected peak value increases at a first rate and decreases at a second rate, and wherein the first rate is less than the second rate.

BRIEF DESCRIPTION OF THE DRAWINGS

In the figures and description like reference numerals refer to like features. Embodiments are now described in detail, by way of example only, illustrated by the accompanying drawings in which.

DETAILED DESCRIPTION OF EMBODIMENTS

Figure 1:
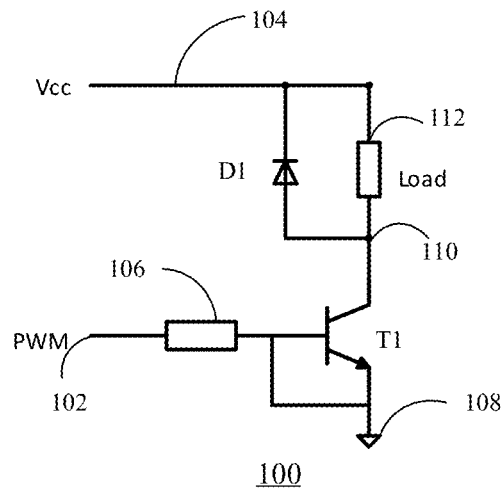
FIG. 1 shows a known single transistor PWM amplifier circuit.
Figure 2:
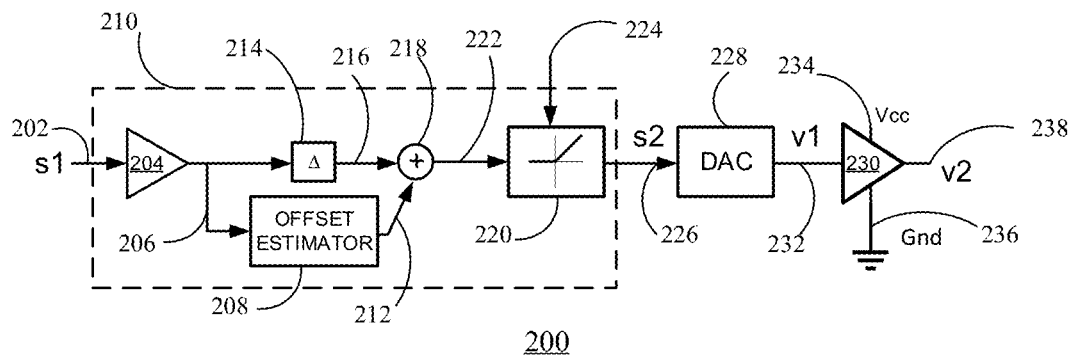
FIG. 2 illustrates a class C amplifier system including an audio processor according to an embodiment.

FIG. 2 shows an amplifier system 200 including an audio processor 210 according to an embodiment. The audio processor 210 includes an optional attenuator 204, an offset estimator 208. An optional delay element 214, a combiner 218, and a clipper 220.

An audio processor input 202 may be connected to an input of the attenuator 204. An attenuator output 206 may be connected to an input of the offset estimator 208 and an input of the delay element 214. The delay element output 216 may be connected to a first input of the combiner 218. The offset estimator output 212 may be connected to a second input of the combiner 218. The combiner output may be connected to a first input 222 of the clipper 220. The clipper 220 may also have a second input 224 for receiving a clip level. In some examples the clip level may be fixed and so the second clipper input 224 may be omitted. The clipper output may be connected to the audio processor output 226 of the audio processor 210.

The audio processor output 226 may be connected to an input of a digital to analog converter (DAC) 228. The digital to analog converter output 232 may be connected to an input of a class C amplifier 230 having a power supply input 234 and a ground input 236. The class C amplifier output may be connected to the amplifier system audio output 238 which may be connected to a loudspeaker (not shown). The audio processor 210 may be implemented in hardware or a combination of hardware and software.

In operation, a digital audio input signal, s1, may be received at the audio processor input 202. The digital audio signal has an average value (DC value) near or equal to zero, and contains positive and negative values which can be considered for example as having a dynamic range of ±1. For the sake of convenience, signal s1 may be referred to as a symmetrical signal, even though the positive half does not necessarily mirror the negative half received at the audio processor input 202. The audio signal may optionally be attenuated by a gain factor, g1, which may be a gain factor of 0.5. Attenuating the signal may be required if the addition of an offset may cause signal values exceeding 1 which may correspond to the digital full-scale value. From this audio input signal s1, an offset value may be determined by the offset estimator 208. In some examples the offset may be estimated by detecting the negative peak values of s1. In one example, all negative peak values may be increased or lifted by addition of an offset to exceed a value s0, which is the minimal digital sample value corresponding to the analog input voltage that can be adequately amplified. For a class C amplifier, the s0 value may correspond to the voltage that is necessary to bias the transistor. In this case, the offset is the absolute value of the lowest negative peak encountered so far.

The resulting time-varying offset value may be added to the audio signal by the combiner 218. The clipper 220 may include a rectifying linear activation unit (ReLU) and the resulting signal may be negatively clipped. The clip level may be determined from a clip level signal received at second clipper input 224. The clip level may be fixed or varying.

The resulting clipped audio signal output from the clipper 220 is output on the audio processor output 226 as a processed signal s2. In this way a signal s1 having a dynamic range [−1,1] may be mapped to a processed signal having a dynamic range [0,1], that is to say positive values only. The processed signal s2 may be converted to an analog signal by digital-to-analog converter (DAC) 228 and then amplified by class C amplifier 230.

In some examples the DAC 228 may generate a PWM signal and the class C amplifier 230 may be implemented as a single-transistor class D amplifier 100. Contrary to a traditional class D amplifier, however, a zero signal value corresponds to a 0% duty cycle, rather than a 50% duty cycle. In other examples the audio processor may map a signal having a dynamic range denoted [−1,1] to a processed signal having a range [0,−1]. This may be done for example by the offset estimator detecting positive peak values, combining the audio signal with the resulting time-varying offset value, and then positive clipping so retaining the negative part of the audio signal. In this case the processed audio signal may then be inverted before amplifying.

The audio processor 210 may allow a class C amplifier to be used in an audio amplifier with reduced distortion and power consumption. Conventionally to amplify a signal s1 using a single supply voltage $V_{cc}$, there are several possibilities, such as a class A and a class AB amplifier. The amplified signal will have a DC value of typically $V_{cc}/2$ and a dynamic range close to $\pm V_{cc}/2$, the gain factor from digital to amplified signal is $V_{cc}/2$. When a loudspeaker is connected, the ground terminal needs to be connected to a virtual ground of $V_{cc}/2$, or the output signal needs to be high-pass filtered, such that the DC component is removed. If a non-zero DC value is present across the loudspeaker terminals, it will result in an offset of the loudspeaker diaphragm, thereby limiting the possible diaphragm displacement.

For amplifying only the positive half of the audio signal, a single-transistor class C amplifier would be sufficient, and the positive half of the digital signal could be mapped to the complete $[0;V_{cc}]$-range, thereby doubling the gain factor. However, it is well-known that this leads to distortions that are unacceptable for audio. The digital audio signal could be scaled down by a factor of 2 and offset by 0.5. However, this would decrease the gain factor to $V_{cc}/2$ and lead to a constant current during silence and a DC of $V_{cc}/2$ at the output. The result would be comparable to the traditional class A amplifier. Alternatively, the negative values of the audio signal can be set to zero, which is then the counterpart of the class C amplifier configuration. This negative clipping leads to heavy distortions and an unacceptable audio quality.

The audio processor 210 modifies a digital audio signal such that it may be amplified by a single transistor amplifier that is designed to amplify only positive or only negative signals at its input, that is to say the respective negative or positive audio samples are clipped to zero. An example amplifier is a class C amplifier which is not typically used for audio because of unacceptable distortion. The audio processor 210 may reduce distortion to an acceptable level which allows a class C amplifier to be used for audio amplification. A class C amplifier can be implemented as a single transistor amplifier and is more efficient than class A or class AB amplifiers. Furthermore, since only the positive (or negative) part of the audio signal is used, the audio processor 210 output may be used to drive a single transistor class D amplifier having a PWM signal with zero duty cycle when there is silence. This may reduce power consumption compared to a conventional class D amplifier. Furthermore the audio processor 210 may be included in a haptic feedback system which may allow a haptic driver implemented as a single-transistor class C or class D amplifier and a haptic transducer to be used for audio with acceptable audio quality.

The inventors have further appreciated that a digital offset of 0.5 is only necessary for worst-case scenarios, where the signal s1 is full-scale and the peak values are consistently hitting full-scale. This can be the case for synthetically generated tones or highly (dynamically) compressed audio. Typical audio signals (both speech and music) show much more dynamic behaviour. In the case of speech, there are even many silent segments during speech pauses. The audio processor 210 uses a varying offset value rather than a fixed value of 0.5 which allows a class C amplifier to be used for audio amplification with reduced distortion and power consumption.

In some examples the offset estimator 208 may asymmetrically smooth the (negative) sample values over time: the resulting peak value, n[k] increases slower than it decreases. An example implementation is:

$$n[k] = \alpha n[k-1] + (1-\alpha)g1s1[k] \tag{1}$$

where $$\alpha = \exp\left(\frac{-1}{\tau_u f_s}\right); \text{ if } n[k] > g1s1[k] \tag{2}$$

and $$\alpha = \exp\left(\frac{-1}{\tau_d f_s}\right); \text{ if } n[k] \leq g1s1[k] \tag{3}$$

where $\tau_u$ is an upwards smoothing time constant applied where the signal values are increasing and $\tau_d$ is a downwards smoothing time constant applied where signal values are decreasing, k indicates time and $f_s$ is the audio sampling rate. In some examples $\tau_d < \tau_u$, for example are $\tau_u = 0.1$ s and $\tau_d = 0.01$ s.

Figure 3:
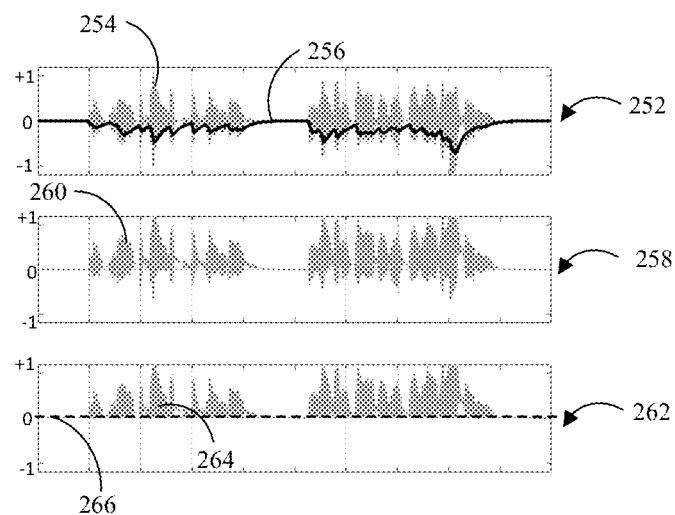
FIG. 3 shows an example waveform of an audio signal and a processed audio signal.

FIG. 3 shows an example waveform 250 for a speech segment. The top panel 252 shows a waveform 254, which is the audio input signal s1, and the estimated time-varying offset 256 generated using smoothed negative peak detection. The middle panel 258 shows the signal 260 at the output of the combiner 218. The offset audio signal is effectively the input signal s1 with the negative of the varying offset signal added in. If the resulting offset signal value is greater than "1" then it is clipped. The combiner 218 may add the negative of the offset to the audio input signal. The bottom panel 262 shows the processed audio signal 264 with the offset added after negative clipping. In this example the clip level 266 is set to zero. It can be observed in the resulting signal that the audio signal is 'lifted up' when the signal is non-zero and that the offset returns to zero during the speech pauses.

The ratio of the smoothing time constants $\tau_u$, $\tau_d$ control the trade-off between power consumption, which is partly determined by the average value of the output audio signal, and the signal quality. If the downwards smoothing time constant is much faster than the upwards smoothing time constant, the signal peaks will be followed more closely, due to which the offset will be higher. As a result, the signal quality will be higher, and the average value of the output audio signal and consequently power consumption in the amplifier will be higher as well.

Different smoothing time constants may be used, depending on the type of signal that is expected. For speech signals, in some examples more distortion could be acceptable, and a lower $$\frac{\tau_u}{\tau_d}$$

ratio could be used. For music signals, a higher audio quality may be desirable, and so a higher $$\frac{\tau_u}{\tau_d}$$

ratio could be used.

The attenuator 204 at the input ensures that the digital signal values will not digitally clip i.e. exceed unity. Alternatively or in additional, a dynamic range compressor (DRC) and/or limiter may be added after the negative clipper. Adding one of an attenuator, limiter or DRC may avoid digital clipping of the processed signal.

One criterion to illustrate the increased efficiency of the audio amplifier system 100 is the ratio between the AC signal and its DC value or offset. The AC signal can be estimated using the standard deviation of the signal values, as this is the square root of the mean square deviation with respect to the mean. This yields a score of 0.35 for the 'class A' approach, a score of 1.35 for the amplifier system 200, and 2.35 for the conventional 'class C' amplifier which would clip the negative signal. The conventional 'class C' approach is most efficient but this is at the cost of unacceptable distortion for audio amplification. The 'class A' approach clearly is less efficient than the other two, but does not introduce distortion.

The perceptual quality can for example be estimated using a PESQ score (perceptual evaluation of speech quality). Taking s1 as the reference speech file, the audio amplifier system 200 returns a PESQ score of 2.88, and the negative clipped version i.e. using a conventional class C amplifier returns a score of 2.25, indicating a much lower speech quality.

The offset that is present in the (digital) processed output signal may be considered as similar to the biasing of the transistor in the analog domain. By increasing the offset, the Q-point of the amplifier can be interpreted to be shifted, allowing negative values. When the digital offset is 0.5, the behaviour of the class C amplifier may be comparable to a class A amplifier. By varying the offset value according to the input signal, the processed signal may result in an audio amplifier with acceptable audio quality and improved efficiency compared to a class A configuration.

In some examples, the clipper 224 may clip the audio signal by applying a soft non-linearity such as a soft version of the rectifying linear activation unit (by implementing a soft knee) or a logistic function:

$$f(x) = \frac{L}{1 + e^{k(x-x0)}},$$

where k is a parameter describing the steepness of the logistic function, and x0 is the centre point of the logistic function, which in the current application, may be a function of the estimated offset.

The audio processor 210 may be used in audio amplifier systems with other amplifiers for example single transistor class D or PWM amplifier 100. In this case the digital-to-analog conversion can be a pulse-width-modulation. The PWM can be designed such that only the positive range of the input signal is mapped to a valid duty cycle and such that the negative values correspond to 0V. That way, the single transistor PWM amplifier 100 designed to amplify only positive samples may be used with acceptable audio quality. If necessary, additional low-pass filtering may be applied.

Figure 4:
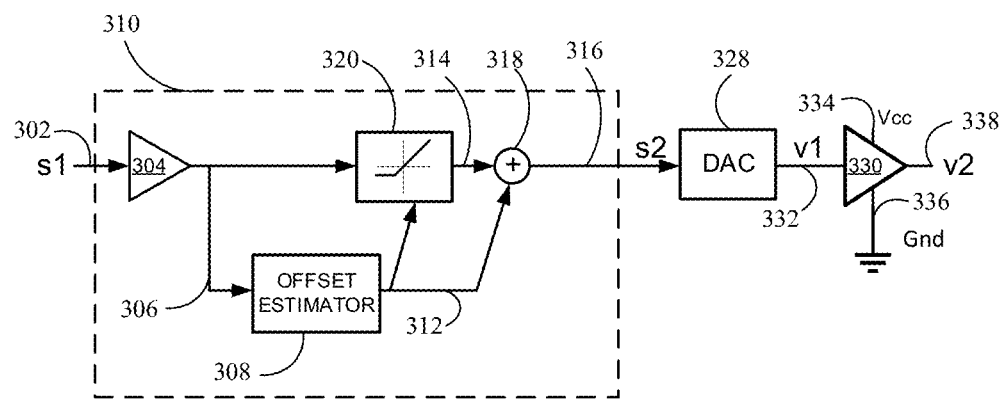
FIG. 4 illustrates a class C amplifier system including an audio processor according to an embodiment.

FIG. 4 shows an amplifier system 300 including an audio processor 310 according to an embodiment. The audio processor 310 includes, an attenuator 304, an offset estimator 308, an combiner 318 and a clipper 320.

An audio processor input 302 may be connected to an input of the attenuator 304. An attenuator output 306 may be connected to an input of the offset estimator 308 and an input of the clipper 320. The clipper output 314 may be connected to a first input of the combiner 318. The offset estimator output 312 may be connected to a second input of the combiner 318. The combiner output may be connected to the audio processor output 316 of the audio processor 310.

The audio processor output 316 may be connected to an input of a digital to analog converter (DAC) 328. The digital to analog converter output 332 may be connected to an input of a class C amplifier 330 having a power supply input 334 and a ground input 336. The class C amplifier output may be connected to the amplifier system audio output 338.

In operation, a digital audio input signal, s1, may be received at the audio processor input 302. The audio signal may optionally be attenuated by the attenuator 304 by a gain factor, g1, which may be a gain factor of 0.5. Attenuating the signal may be required if the addition of an offset may cause signal values exceed the digital full-scale value. From this audio input signal s1, an offset value is estimated by the offset estimator 308. In some examples the offset may be estimated by detecting the negative peak values of s1. In one example, all negative peak values may be increased or lifted by addition of an offset to a value s0, which is the minimal digital sample value corresponding to the analog input voltage that can be adequately amplified. For a class C amplifier, the s0 value corresponds to the voltage that is necessary to bias the transistor. In this case, the offset is the absolute value of the lowest negative peak encountered so far.

The clipper 320 may include a rectifying linear activation unit, ReLU, and the resulting signal may be negatively clipped. The clip level may correspond to the time-varying offset value. The resulting clipped audio signal output from the clipper 320 is output to the combiner 318. The offset value from the offset estimator 308 may then be combined by the combiner 318 by adding the negative of the offset value to or subtracting the offset value from the clipped audio signal. The processed signal from the combiner output may then be provided to the audio processor output 316. In some examples a DRC or limiter (not shown) may receive the signal from the combiner output and limit the audio signal to avoid positive clipping before providing the processed signal to the audio processor output 316.

In this way, a signal s1 having a dynamic range denoted for example as [−1,1] may be mapped to a processed signal having a dynamic range [0,1], that is to say positive values only. The processed signal s2 may be converted to an analog signal by digital-to-analog converter (DAC) 328 and then amplified by class C amplifier 330. The audio processor 310 applies clipping and offset combining in a different order to the audio processor 210 but the resulting processed signal is similar in both cases.

Figure 5:
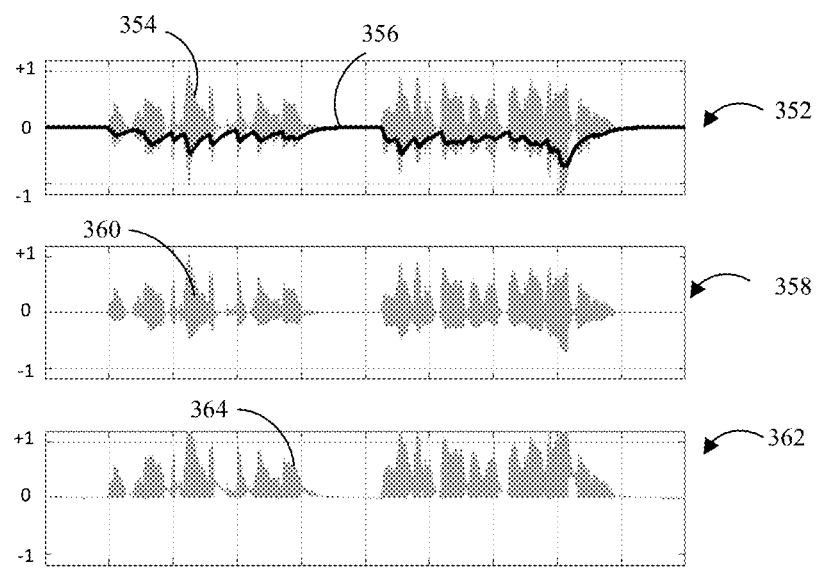
FIG. 5 shows an example waveform of an audio signal and a processed audio signal.

This is illustrated in FIG. 5 which shows an example waveform 350 for a speech segment showing the effect of processing by the audio processor 310. The top panel 352 shows a waveform 354, which is the audio input signal s1, and the estimated time-varying offset 356 generated using smoothed negative peak detection. The middle panel 358 shows the signal 360 at the output of the clipper 320 showing the effect of the variable clip level. The bottom panel 362 shows the processed audio signal 364 with the offset added after negative clipping. It can be observed in the resulting signal that the audio signal is 'lifted up' when the signal is non-zero and that the offset returns to zero during the speech pauses. The resulting processed signal 364 is similar to that produced by audio processor 210.

In some examples the DAC 328 may generate a PWM signal and the Class-C amplifier 330 may be replaced by the single-transistor class D amplifier 100. In other examples the audio processor 310 may map a signal having a range [−1,1] to a processed signal having a range [0,−1]. This may be done for example be the offset estimator detecting positive peak values and then positive clipping so retaining the negative part of the audio signal. In this case the processed audio signal may then be inverted before amplifying.

Audio processor 310 modifies a digital audio signal such that it may be amplified by an amplifier that is designed to only amplify only positive or negative signals at its input (i.e., the respective negative or positive audio samples are clipped to zero). An example amplifier is a class C amplifier which is not typically used for audio because of unacceptable distortion. The audio processor 310 may reduce distortion to an acceptable level which allows a class C amplifier to be used for audio amplification. A class C amplifier can be implemented as a single transistor amplifier and is more efficient than class A or class AB amplifiers.

Figure 6:
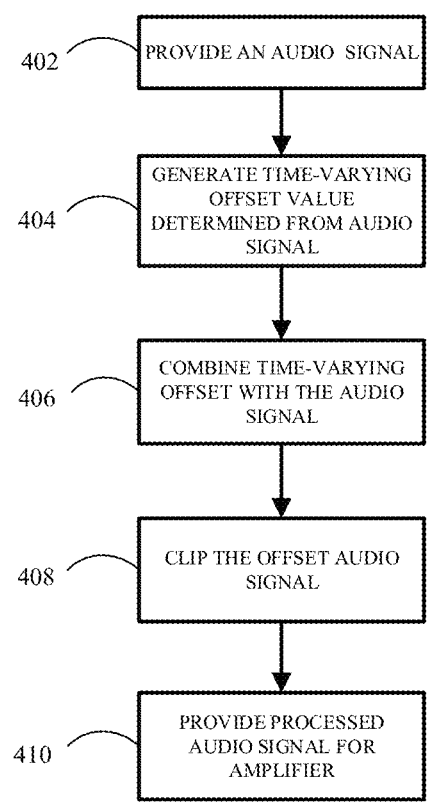
FIG. 6 shows a method of audio processing for an amplifier system according to an embodiment.

FIG. 6 shows a method of audio processing 400 suitable for an amplifier system including a class C amplifier or single transistor class D amplifier according to an embodiment. In step 402 an audio signal is provided. In step 404 a time-varying offset value determined from the audio input signal may be generated. In step 406 the time-varying (variable) offset may be combined with the audio signal by addition or subtraction. In step 408 the offset audio signal may be clipped for example by applying a RELU, logistic function or other function to the signal. The clip level may be fixed or variable. In some examples the clip level may be zero. Following from step 408, in step 410 the clipped audio signal may be provided as the processed audio signal for a class C amplifier or single transistor PWM amplifier after digital to analog conversion.

Figure 7:
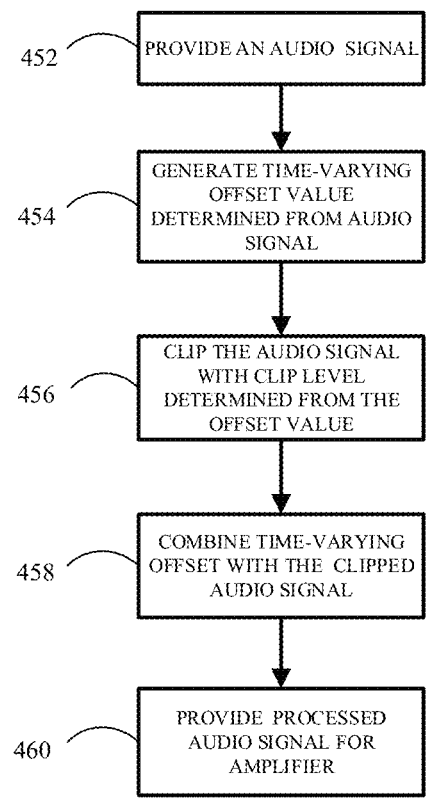
FIG. 7 shows a method of audio processing for an amplifier system according to an embodiment.

FIG. 7 shows a method of audio processing 450 suitable for an amplifier system including a class C amplifier or single transistor class D amplifier according to an embodiment. In step 452 an audio signal is provided. In step 454 a time-varying offset value determined from the audio input signal may be generated. In step 456 the audio signal may be clipped for example by applying a RELU, logistic function or other function to the signal. The clip level may be the variable offset value or value determined from the variable offset value. In step 458 the time-varying (variable) offset may be combined with the clipped audio signal by addition or subtraction. Following from step 458, in step 460 the offset audio signal may be provided as the processed audio signal to an amplifier such as a class C amplifier or single transistor PWM amplifier after digital to analog conversion.

The methods 400, 450 when used in an audio amplifier system may allow a more efficient single transistor class C amplifier to be used instead of class A, or class AB amplifiers with acceptable audio quality. Alternatively a single transistor class D amplifier may be used with a zero duty cycle when there is no audio which is also more efficient than class A or class AB amplifiers.

Embodiments of the audio processor and methods of audio processing described may modify an audio signal such that it contains only positive (or only negative) values while retaining acceptable audio quality. The modified signal can then be sent to an amplifier that is designed to amplify only positive (or only negative) signal values, such as a class C amplifier, or an amplifier for a PWM signal that encodes only positive signal values or only negative signal values.

Some embodiments may add a slowly varying offset, which lifts up the signal by a fraction before setting the negative values to zero. This may allow the signal energy to decrease by less than the 3 dB expected from only using the positive half of the signal.

The modified signal can be used in a system with an amplifier that is designed to only amplify positive signal values which may be lower cost and/or more efficient. Embodiments included in an amplifier system may include a simpler amplifier stage which has only slightly lower performance in terms of perceptual audio quality and loudness than a traditional class AB or class D amplifier, and with better efficiency than a class A amplifier. Embodiments may be included in a haptic feedback system where a haptic actuator may also provide audio output.

An audio processor and method of audio processing for an amplifier system is described. The audio processor may receive an audio signal and adapt the audio signal generating a time varying offset. The time varying offset may be combined with the audio signal resulting in a shifted the audio signal level. The processed audio signal may also be clipped to remove the negative samples values. The processed signal may be used to drive an amplifier designed to only accept positive (or negative) signals such as a class C amplifier.

In some example embodiments the set of instructions/method steps described above are implemented as functional and software instructions embodied as a set of executable instructions which are effected on a computer or machine which is programmed with and controlled by said executable instructions. Such instructions are loaded for execution on a processor (such as one or more CPUs). The term processor includes microprocessors, microcontrollers, processor modules or subsystems (including one or more microprocessors or microcontrollers), or other control or computing devices. A processor can refer to a single component or to plural components.

Example embodiments of the material discussed in this specification can be implemented in whole or in part through network, computer, or data based devices and/or services.

These may include cloud, internet, intranet, mobile, desktop, processor, look-up table, microcontroller, consumer equipment, infrastructure, or other enabling devices and services. As may be used herein and in the claims, the following non-exclusive definitions are provided.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable sub combination.

For the sake of completeness it is also stated that the term "comprising" does not exclude other elements or steps, the term "a" or "an" does not exclude a plurality, a single processor or other unit may fulfil the functions of several means recited in the claims and reference signs in the claims shall not be construed as limiting the scope of the claims.

The invention claimed is:

1. An audio processor for an amplifier system, the audio processor comprising:
   an audio processor input configured to receive an audio signal; and
   an audio processor output configured to be coupled to an amplifier; wherein the audio processor is configured to process the audio signal by:
      determining a time-varying offset value from the audio signal;
      clipping the audio signal with a clip level being determined from the time-varying offset value;
      combining the time-varying offset with the clipped audio signal; and
      outputting the processed audio signal on the audio processor output.

2. The audio processor of claim 1 further comprising:
   an offset estimator having an offset estimator input coupled to the audio processor input and an offset estimator output;
   a series arrangement of a combiner and a clipper between the audio processor input and the audio processor output;
   and wherein
   the offset estimator is configured to generate the time-varying offset;
   the combiner is configured to combine the time-varying offset with the clipped audio signal; and
   the clipper is configured to clip the audio signal by modifying at least one of the respective audio signal values above a first clip level value and the respective audio signal values below a second clip level value.

3. The audio processor of claim 2 wherein a first clipper input is coupled to the audio processor input, a second clipper input is coupled to the offset estimator output, and a clipper output coupled to a first combiner input, a second combiner input is coupled to the offset estimator output, and the audio processor output is coupled to the combiner output wherein one of the first clip level and the second clip level is determined from the offset estimator output.

4. The audio processor of claim 2, wherein the clipper comprises at least one of a rectifying linear activation unit and a logistic function module.

5. The audio processor of claim 2, wherein the offset estimator comprises a peak detector and is configured to determine the time-varying offset value from one of detected negative peak values and detected positive peak values of the audio signal.

6. The audio processor of claim 5, wherein the peak detector comprises a smoothing filter, and the absolute value of the detected peak value increases at a first rate and decreases at a second rate, and wherein the first rate is less than the second rate.

7. The audio processor of claim 2 further comprising: an attenuator arranged between the audio processor input and the combiner.

8. An audio amplifier system comprising the audio processor of claim 1 and a series arrangement of a digital to analog converter, DAC, and an amplifier circuit, wherein the audio processor output is coupled to the DAC input and wherein the amplifier circuit is configured as one of a class C amplifier and a class D amplifier.

9. The audio amplifier system of claim 8 wherein the amplifier circuit comprises a single-transistor amplifier circuit.

10. A method of audio processing for an amplifier system, the method comprising:
    providing an audio signal;
    generating a time-varying offset value determined from the audio signal;
    providing a processed audio signal by:
       clipping the audio signal with a clip level being determined from the time-varying offset value, and combining the time-varying offset value with the clipped audio signal; and
       outputting the processed audio signal.

11. The method of claim 10, wherein clipping the audio signal further comprises modifying at least one of the respective audio signal values above a first clip level value and the respective audio signal values below a second clip level value.

12. The method of claim 10, wherein clipping the audio signal further comprises applying one of a rectifying linear activation function and a logistic function.

13. The method of claim 10, wherein generating a time-varying offset comprises detecting a negative peak value or positive peak value of the audio signal.

14. The method of claim 13, wherein detecting a negative peak value or positive peak value comprises applying a smoothing filter, and wherein the absolute value of the detected peak value increases at a first rate and decreases at a second rate, and wherein the first rate is less than the second rate.

15. The method of claim 13 further comprising attenuating the audio signal.

16. The method of claim 13 further comprising: delaying the audio signal before combining the time-varying offset with the audio signal or the clipped audio signal.

* * * * *